(12) United States Patent
Tang et al.

(10) Patent No.: US 8,179,109 B2
(45) Date of Patent: May 15, 2012

(54) METHODS AND APPARATUS FOR A POWER SUPPLY WITH SEQUENTIALLY-ACTIVATED SEGMENTED POWER SWITCH

(75) Inventors: Benjamim Tang, Rancho Palos Verdes, CA (US); Kenneth A. Ostrom, Palos Verdes Estates, CA (US); Laura Carpenter, Palos Verdes Estates, CA (US)

(73) Assignee: Infineon Technologies Austria AG, Villach (AT)

( * ) Notice: Subject to any disclaimer, the term of this patent is extended or adjusted under 35 U.S.C. 154(b) by 647 days.

(21) Appl. No.: 12/043,306

(22) Filed: Mar. 6, 2008

(65) Prior Publication Data

US 2009/0224734 A1    Sep. 10, 2009

(51) Int. Cl.
*G05F 1/613* (2006.01)
(52) U.S. Cl. ............................ 323/282; 323/272; 326/87
(58) Field of Classification Search .................. 323/282, 323/272; 326/87, 88, 91–92
See application file for complete search history.

(56) References Cited

U.S. PATENT DOCUMENTS

| | | | | |
|---|---|---|---|---|
| 6,043,634 A * | 3/2000 | Nguyen et al. | ................. | 323/272 |
| 6,310,468 B1 * | 10/2001 | Feldtkeller | ..................... | 323/282 |
| 6,380,770 B1 * | 4/2002 | Pasqualini | ..................... | 327/112 |
| 6,429,633 B1 * | 8/2002 | Kajiwara et al. | ................. | 323/282 |
| 6,734,656 B2 * | 5/2004 | Miller et al. | ................. | 323/284 |
| 6,930,473 B2 * | 8/2005 | Elbanhawy | .................... | 323/282 |
| 7,741,822 B2 * | 6/2010 | Chen et al. | ..................... | 323/272 |
| 2005/0030770 A1 * | 2/2005 | Sutardja et al. | .................. | 363/41 |
| 2005/0116753 A1 * | 6/2005 | Martelloni | ..................... | 327/170 |

* cited by examiner

*Primary Examiner* — Harry Behm
(74) *Attorney, Agent, or Firm* — Murphy, Bilak & Homiller, PLLC

(57) ABSTRACT

Methods and apparatus for a power supply according various aspects of the present invention operate in conjunction with a voltage converter for converting an input voltage to an output voltage. For example, the converter may comprise a controller configured to generate a control signal and an integrated power stage. The power stage may include a segmented switch coupled in parallel between the input voltage and the output, and a driver circuit responsive to the controller and connected to the switches. The segmented switches may be parallel devices with separate gates, which may be activated independently. The driver circuit controls the switches according to the control signal to sequentially activate the switches in the switch circuit. For example, the driver circuit may activate a second switch following a predetermined period after activating a first switch, and the first switch and second switch may be activated sequentially and remain activated simultaneously.

18 Claims, 4 Drawing Sheets

METHODS AND APPARATUS FOR A POWER SUPPLY WITH SEQUENTIALLY-ACTIVATED SEGMENTED POWER SWITCH

BACKGROUND OF INVENTION

Many high power applications use switching power supplies, in part due to the small area and volume they occupy. Converters used for a typical switching power supply include active components and passive components. For high power applications, the active components are discrete, not integrated, because of the difficulty associated with integrating high power components and controlling heat dissipation.

Switching power supplies have a number of problems associated with them. For example, the switching supplies require power MOSFETs to handle the high currents required by the high powered applications. These MOSFETs are significantly larger than typical MOSFETs, and have high parasitic capacitances associated with them, which reduce the overall performance of the system. Further, the highly specialized drivers to the drive the large gate-to-source capacitance of power MOSFETs must be very well controlled. If the drivers are not well controlled, unnecessary capacitive switching losses are introduced into the system.

Switching the power MOSFETs on and off also requires large currents, which creates a significant amount of system noise through coupling and ground return path parasitics. The large currents provided to the MOSFETs also create a drop in the power supply, preventing the MOSFETs from turning on completely until the power supply has recovered. The drop is due, in part, to the parasitic inductance of the decoupling capacitor, which provides the instantaneous power required to activate the MOSFETs.

In addition, the MOSFETs are timed to ensure that one is fully off before the other turns on, creating a large non-overlap time and causing losses to power efficiency. The timing between turning oil one transistor and turning off another are set up to minimize shoot-thru current, which occurs when both transistors are on. This is done by ensuring that one FET is fully off before turning oil the other FET, which is controlled by non-overlap logic. In discrete power stages, the non-overlap time can be significant, causing loss in power efficiency because the output current must be provided by a diode during the non-overlap time.

SUMMARY OF THE INVENTION

Methods and apparatus for a power supply according to various aspects of the present invention operate in conjunction with a voltage converter for converting an input voltage to an output voltage. For example, the converter may comprise a controller configured to generate a control signal and an integrated power stage. The power stage may include multiple switches coupled in parallel between the input voltage and the output, and a driver circuit responsive to the controller and connected to the switches. The driver circuit controls the switches according to the control signal to sequentially activate the switches in the switch circuit. For example, the driver circuit may activate a first switch, wait a predetermined period of time, and then activate a second switch prior to deactivating the first switch.

BRIEF DESCRIPTION OF THE DRAWINGS

A more complete understanding of the present invention may be derived by referring to the detailed description and claims when considered in connection with the following illustrative figures. In the following figures, like reference numbers refer to similar elements and steps throughout the figures.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION OF EXEMPLARY EMBODIMENTS

The present invention may be described in terms of functional block components and various processing steps. Such functional blocks may be realized by any number of hardware or software components configured to perform the specified functions and achieve the various results. For example, the present invention may employ various switches that may be implemented in any appropriate manner, such as using field effect transistors, diodes, latches, bipolar transistors, and the like, which may carry out a variety of functions. In addition, various aspects of the present invention may be practiced in conjunction with a variety of converter and/or control applications, and the system described is merely one exemplary application for the invention. Further, the present invention may employ any number of conventional techniques for regulating a power supply, driving a voltage switch, controlling a driver, filtering a signal, implemented a logic gate, and the like.

Figure 1:
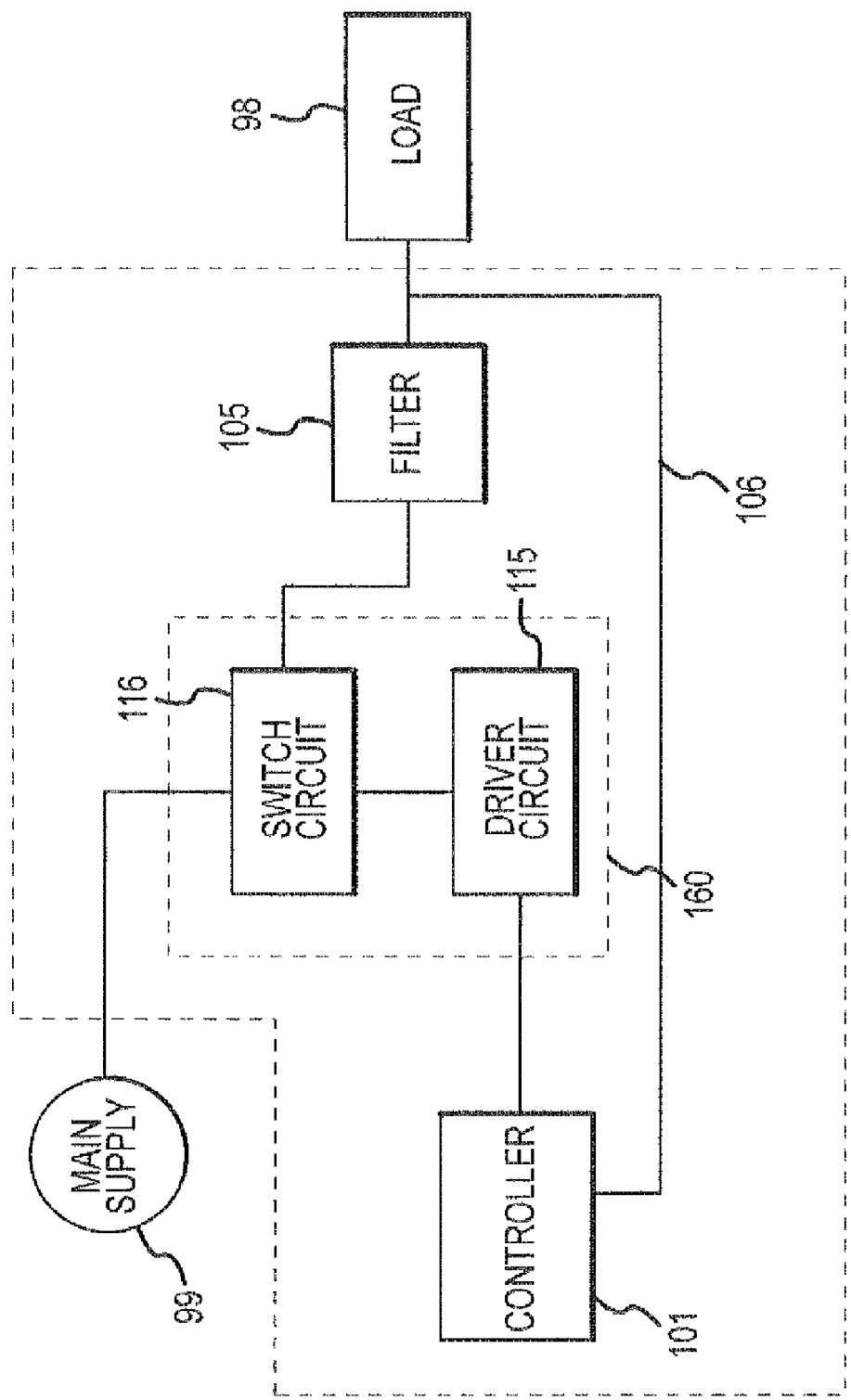
FIG. 1 is a block diagram of a power supply connected to a load.

Various representative implementations of the present invention may be implemented in conjunction with a power supply. The power supply may comprise, for example, a converter using step-down, step-up, buck, boost, buck-boost, forward, flyback, half-bridge, full-bridge, and/or SEPIC topologies. Referring now to FIG. 1, a switching power supply 100 according to various aspects of the present invention comprises a buck converter including a controller 101, a filter 105, and a power stage 160. Generally, the controller 101 provides a control signal to the power stage 160 to control the output of the power stage 160. The power stage 160 responds to the control signal to maintain, increase, or decrease the output voltage and/or current provided to a load 98. The filter 105 smoothes the output signal to supply a relatively level output voltage.

The switching power supply 100 may be adapted for high power applications, such as providing high current at low voltages, for example for supplying high-performance integrated circuits such as microprocessors, graphics processors, and network processors. The switching power supply 100 may be adapted to be placed as close as possible to the load to minimize board trace losses, for example in a distributed power supply system referred to as "Point-of-Load". The switching power supply 100 may also be optimized for high efficiency and small area and volume requirements.

For example, the components can be integrated, partially integrated (e.g., just the drivers and switches), or discrete. In the present embodiment, the switching power supply 100 comprises an integrated power stage 160 configured for high current applications, such as about 10 to 50 amperes. The integrated power stage 160 may either fully integrate all components, or partially integrate a few components. For example, integrating a driver circuit 115 and a switch circuit 116 of the power stage 160 may significantly reduce or eliminate parasitic capacitances and inductances associated with the critical swing, input voltage, ground, and switch gates compared to a discrete design.

The controller 101 controls the power stage 160 to regulate the output, such as the voltage, current, and/or frequency. The controller 101 may comprise any appropriate system and operate in any suitable manner to control the power stage 160, such as a feedback amplifier or pulse width modulation (PWM) controller. For example, the controller 101 may sense an output voltage, such as via a feedback loop 106, and compare the output voltage to a reference voltage. The controller 101 may then adjust the power stage 160 to maintain or change an output voltage of the power stage 160.

In the present embodiment, the controller 101 comprises a PWM controller. The PWM controller controls the power stage 160 by comparing the output voltage of the power stage 160 to a reference voltage and varying the duty cycle of the control signal provided to the power stage 160. The output voltage may be scaled relative to the reference voltage through the use of a resistive divider or similar circuit.

The filter 105 smoothes the output of the power stage 160. The filter 105 may comprise any appropriate system for smoothing the power stage 160 output, such as an analog or digital filter, and may comprise any device or combination of devices for regulating a voltage, such as capacitors, resistors, inductors, integrated circuits, and the like. In an exemplary embodiment, referring to FIGS. 2 and 3, the filter 105 comprises an output inductor 112 and an output capacitor 113. The output inductor 112 may comprise a conventional inductor comprising, for example, wire wound around a core or a conducting loop embedded in a core. In the present embodiment, the output inductor 112 is configured to handle the load current without saturating and have low series resistance, such as less than about 1 mohm, to minimize thermal loss. Typical values for the output inductor 112 may be, for example, 50 nH to 1 uH, and for the output capacitor 113 about 100 uF to 1000 uF. In various embodiments, the filter 105 may be omitted, for example if the power supply 100 does not require a level output voltage or includes a dedicated input filter.

The power stage 160 supplies power according to the control signal from the controller 101. The power stage 160 is directly or indirectly connected to the controller 101 and the filter 105 such that the power stage 160 responds to the control signal from the controller 101 to control the output provided to the filter 105. In the present embodiment, the power stage 160 includes an input connected to the controller to receive the control signal and an output connected to the filter 105.

The power stage 160 may comprise any circuit or other system for providing power according to the control signal, such as an amplifier or converter. In the present embodiment, the power stage 160 comprises a step-down converter or other system for converting an input voltage into an output voltage. The present step-down converter increases average output voltage in response to a longer duty cycle of the control signal, and conversely decreases average output voltage in response to a shorter duty cycle. For example, referring again to FIGS. 2 and 3, the power stage 160 may comprise a segmented switch circuit 116 comprising one or more switches 103, 104 and a segmented driver circuit 115 comprising one or more drivers 102, 108, 109. Each segment may include one control switch, one synchronous switch and one driver or may include multiple switches and drivers. The switches 103, 104 alternately supply higher and lower signals to the filter 105. The drivers 102, 108, 109 control the switches 103, 104 according to the control signal. The segmented aspect of the integrated power stage 160 facilitates dynamic transition control for activating and deactivating the switches 103, 104.

Figure 2:
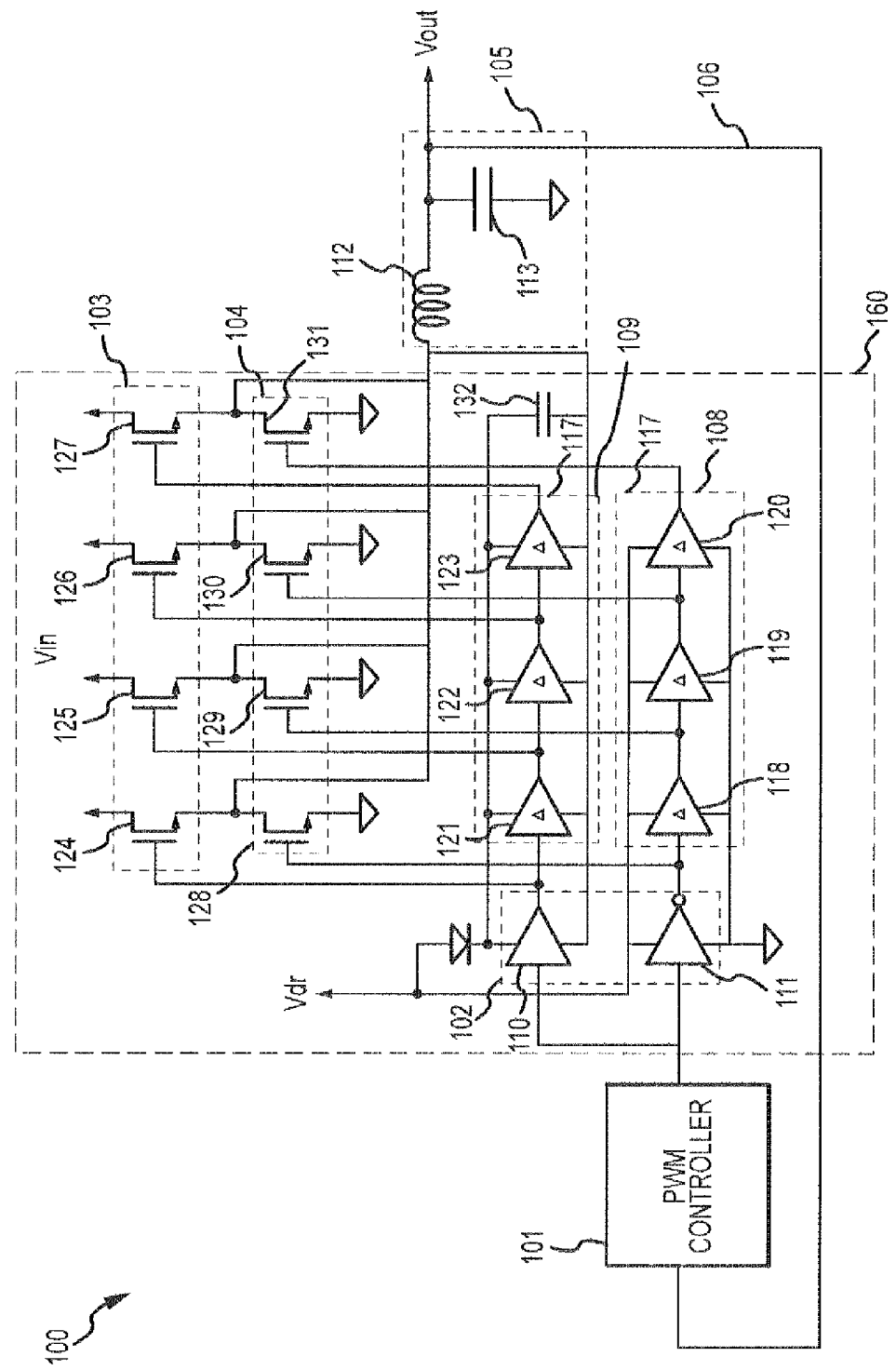
FIG. 2 is a schematic of a switching power supply according to various aspects of the present invention.
Figure 3:
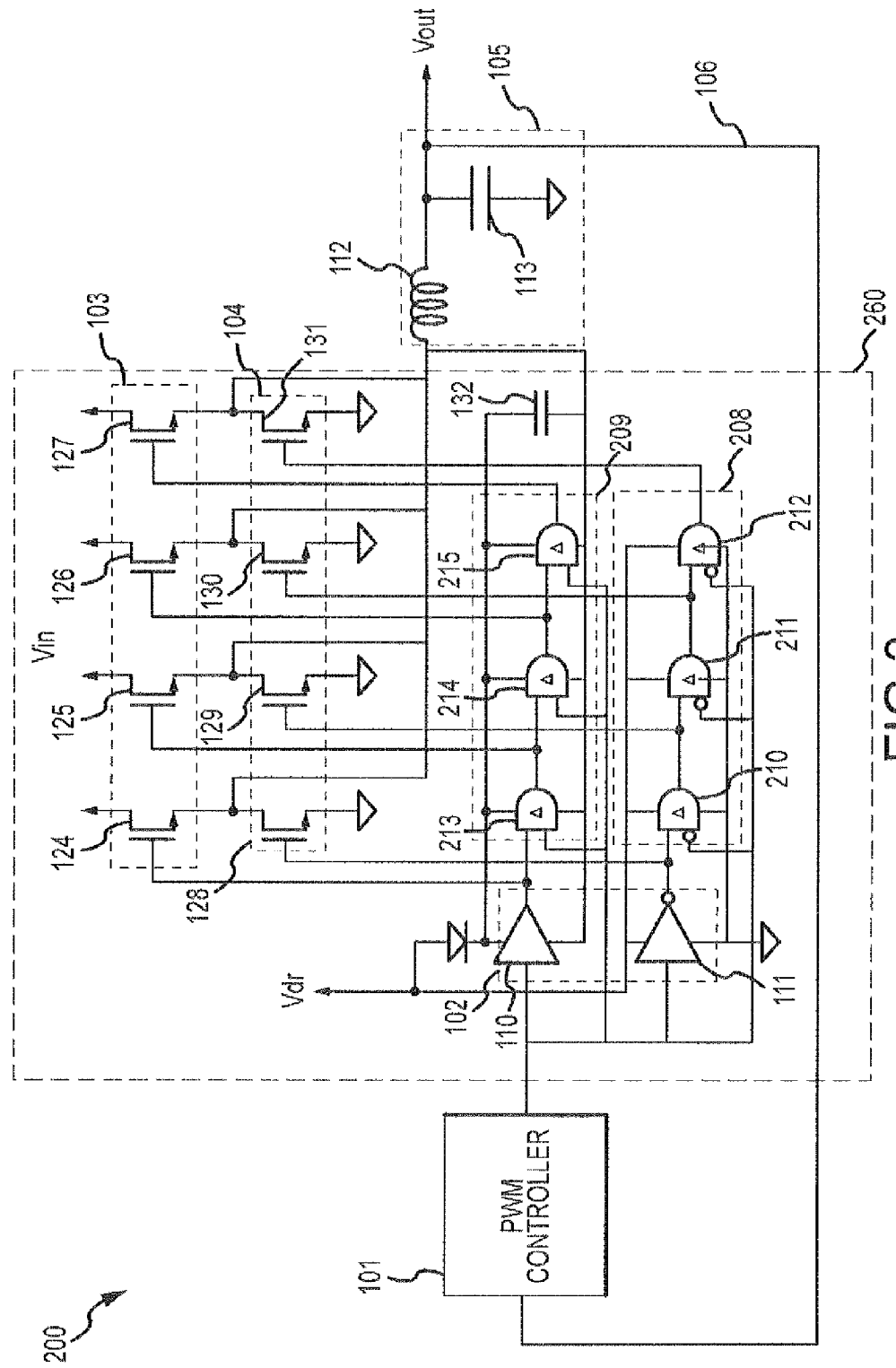
FIG. 3 is a schematic of an alternative switching power supply according to various aspects of the present invention.

The power stage 160 may comprise any appropriate number of switches 103, 104 and drivers 102, 108, 109. Although FIGS. 2 and 3 illustrate eight drivers and eight switches, the power stage 160 may include any suitable number of drivers and switches, such as twelve control switches 103, twelve synchronous switches 104, two leading drivers 102, ten control drivers 109, and ten synchronous drivers 108.

The various components may be placed on an integrated circuit chip in any manner. For example, the hotter-running components may be placed towards the edge of the chip. Integrating the drivers and the switches on the chip allows for all signals to be internal to the chip and the drivers and output devices may be segmented so as to avoid increasing the total area requirement and have individual control over each segment. Also, the integration may significantly reduce or eliminate parasitic capacitance and inductances. The power stage 160 may, however, be implemented in any suitable manner to allow it to receive the signal from the controller 101 and output a voltage based on that signal.

The driver circuit 115 controls the switch circuit 116 according to the control signal. For example, if the control signal indicates that the output voltage should be increased, the driver circuit 115 adjusts the switch circuit 116 to increase the output voltage of the power stage 160. Conversely, if the control signal indicates that the output voltage should be decreased, the driver circuit 115 adjusts the switch circuit 116 to decrease the output voltage of the power stage 160. The driver circuit 115 receives the control signal, directly or indirectly, from the controller 101, and the driver circuit 115 is directly or indirectly connected to the switch circuit 116 to control the switches 103, 104. In the present embodiment, the driver circuit 115 includes a leading driver circuit 102 connected to the controller 101 to receive the control signal and a delay circuit 117 to propagate the control signal to different elements of the switch circuit 116 after one or more delays.

The driver circuit 115 may comprise any system for propagating the control signal to elements of the switch circuit 116 after one or more delays, such as a processor-based system generating control signals at intervals, or a conventional delay circuit. In the present embodiment, the delay circuit 117 comprises one or more delay elements, such as amplifiers, buffers, or logic gates, connected in series so that the first delay element receives the control signal, and each subsequent delay element receives the output from a preceding delay element. The output of each delay element is also connected to the switch circuit 116. The switch circuit 116 thus receives a signal from each delay element in response to the control signal, with each subsequent delay element generating the signal after the delay induced by the preceding delay element.

Referring to FIGS. 2 and 3, the present driver circuit 115 comprises two leading drivers 102, a series of synchronous drivers 108, and a series of control drivers 109. The leading drivers 102 receive the control signal from the controller 101. The control signal is transmitted by the leading drivers 102 to the synchronous and control drivers 108, 109. Depending on the output of the controller 101, the drivers 102, 108, 109 either apply or restrict voltage to the switches 103, 104. Each control driver 109 and synchronous driver 108 does not receive the control signal until the leading drivers 102 and any preceding drivers have received the control signal. The delays associated with the leading drivers 102 and preceding control drivers 109 creates a cascading response of the downstream control switches 103 and synchronous switches 104. The segmented nature of the driver circuit 115 and the switch circuit 116 makes it possible to operate the switches 103, 104 using smaller voltages and/or currents, which tends to reduce switching noise, prevent large sudden power demands for driving the switch circuit 116, reduce the non-overlap time required to avoid shoot-through current, and increase the reliability of the system.

The drivers 102, 108, 109 may comprise any system for providing a signal to an electrical switch and relaying the signal to other components, such as a logic gate, a CMOS gate, an amplifier, a transistor, electromagnetic relays and the like. In the present embodiment, the drivers 102, 108, 109 comprise programmable integrated logic gates. The drivers 102, 108, 109 may be set to any type of control logic, such as OR, NOR, AND, and XOR, and may include delay logic which delays transmitting the control signal from the controller 101 to the subsequent driver. Also, the drivers 102, 108, 109 may be implemented with any combination of logic or components. For example, the drivers 102, 108, 109 may be implemented with only a few drivers including the delay logic, all of the drivers including the delay logic, or a combination of drivers with the delay and drivers without the delay. In addition, the delay logic may not require a delay, as the inherent response time of the drivers in their normal operation may be enough to incrementally turn on the switches 103, 104.

The delay logic may be configured according to any appropriate criteria. For example, the delay logic may induce a delay sufficient to minimize ringing, overshoot, and undershoot at the switch output or switch input. The delay may not be so long, however, as to cause undesirable switching losses. In various exemplary embodiment, the duration of the delay may be in the range of about 1 ns to 20 ns.

The drivers 102, 108, 109 may be configured to provide appropriate voltage and/or current to control the switches 103, 104. For example, if the switches 103, 104 have large gate capacitances for activating the switches, the drivers 102, 108, 109 may generate high peak currents, such as generating about five amperes. In addition, the drive level of the drivers 102, 108, 109 may be controlled to provide sufficient voltage to fully turn on the switches 103, 104, but no higher than necessary so that capacitive switching losses are minimized.

The leading drivers 102 receive the control signal from the controller 101 and transmit responsive signals to the switch circuit 116 and to the control drivers 109 and synchronous drivers 108. The leading drivers 102 are directly or indirectly connected to the controller 101 to receive the control signal, and to the switch circuit 116 and the control drivers 109 and synchronous drivers 108 to propagate the control signal. The leading drivers 102 may comprise any system for receiving and propagating the control signal at appropriate power levels and times, such as amplifiers or buffers.

In the present embodiment, the leading drivers 102 comprise an inverting driver 111 and a non-inverting driver 110, each of which has an input connected to the controller 101 to receive the control signal. The non-inverting driver 110 output is connected to the gate of the first control switch 124 and the input of the first control driver 121. Likewise, the inverting driver 111 output is connected to the gate of the first synchronous switch 128 and the input of the first synchronous driver 118. Thus, the synchronous and control drivers 108, 109 do not receive the control signal from the controller 101 until the leading drivers 102 have received the control signal.

The control drivers 109 sequentially propagate the control signal to the remaining control switches 103. The control drivers 109 may comprise a series of drivers 121, 122, 123, and may comprise any suitable number of drivers, such as one, four, twelve or more. The first control driver 121 is electrically connected to the non-inverting driver 110, and each remaining control driver 122, 123 is connected to the output of the preceding control driver 121, 122. Thus, the control drivers 109 do not receive the propagating control signal from the controller 101 until the non-inverting driver 110 and all preceding control drivers 109 have received the signal. In response to receiving the propagating control signal, each control driver 109 provides the control signal, after a selected delay, to the following control driver and a corresponding control switch 103.

Activating the control switches 103 may require a significant amount of voltage and/or current. The drivers 110, 109 may provide this gate charge by drawing high currents from a voltage source $V_{dr}$. The driver voltage source $V_{dr}$ may be any system or component capable of providing power, such as a capacitor, a battery, an inductor or the like. Additionally, the driver voltage source $V_{dr}$ may include a device for regulating the voltage, such as a diode, a transistor, a capacitor, or an inductor. The power stage 160 may operate without a separate driver voltage and the voltage may be provided by the input voltage, the controller 101, or any other appropriate component.

If the voltage source $V_{dr}$ cannot provide for a large instantaneous change in the current, for example due to its output inductance, the power stage 160 may include a decoupling capacitor 132 connected to the voltage source $V_{dr}$ and the power inputs of the non-inverting driver 110 and the control drivers 109. Because the segmented power stage 160 permits staggering the turn-on times of each segment of the switch circuit 116, less instantaneous current is required, causing less droop than simultaneous turn-on. Consequently, a smaller decoupling capacitance with higher parasitic inductance may be used than in systems utilizing a single activation current.

The synchronous drivers 108 sequentially propagate the inverse of the control signal to the remaining synchronous switches 104. The synchronous drivers 108 may comprise a series of drivers 118, 119, 120, and may comprise any suitable number of drivers, such as one, four, twelve or more. The first synchronous driver 118 is electrically connected to the inverting driver 111, and each remaining synchronous driver 119, 120 is connected to the output of the preceding synchronous driver 118, 119. Thus, the synchronous drivers 108 do not receive the propagating inverse control signal from the controller 101 until the inverting driver 111 and all preceding synchronous drivers 108 have received the signal. In response to receiving the propagating inverse control signal, each synchronous driver 108 provides the inverted control signal, after a selected delay, to the following synchronous driver and a corresponding synchronous switch 104.

Thus, the leading, synchronous, and control drivers 102, 108, 109 control the control and synchronous switches 103, 104 based on the output from the controller 101. The drivers 102, 108, 109 control the switches 103, 104 by applying and restricting voltage. When the control signal is high, the non-inverting driver 110 and the control drivers 109 sequentially activate the control switches 103, and the inverting driver 111 and the synchronous drivers 108 sequentially deactivate the synchronous switches 104. Likewise, when the control signal is low, the noninverting driver 110 and the control drivers 109 sequentially deactivate the control switches 103, and the inverting driver 111 and the synchronous drivers 108 sequentially activate the synchronous switches 104.

Referring to FIG. 3, in an alternative embodiment, an alternative driver circuit 215 may be configured to sequentially activate the control switches 103 and collectively deactivate the synchronous switches 104, and/or collectively activate the control switches 103 and sequentially deactivate the synchronous switches 104. The timing for deactivating the control switches 103 and/or the synchronous switches 104 may be modified independently of the activation sequence, and vice versa. The driver circuit 115 may be configured to allow the control switches 103 and synchronous switches 104 to activate and deactivate simultaneously or sequentially, or allow some of the switches 103, 104 to be activated or deactivated simultaneously while the rest of the switches 103, 104 are activated and deactivated sequentially, or in any other combination.

For example, the alternative driver circuit 215 provides sequential activation of the control switches 103 and simultaneous deactivation of the synchronous switches 104, and vice versa. The alternative driver circuit 215 comprises a series of linked synchronous drivers 208 and a series of linked control drivers 209. In the present embodiment, the linked synchronous and linked control drivers 208, 209 comprise AND-type logic gates. Delay logic may be included in the gates, or the driver circuit 215 may rely upon the inherent delay associated with propagating the control signal by the gates. The logic may be set to any suitable function, with or without the delay, such as OR, XOR, or NOR functions.

The controller 101 provides the control signal to the leading drivers 102 as well as to an input of each AND gate of the linked synchronous drivers 208 and the linked control drivers 209. The input of the linked synchronous drivers 208 connected to the control signal is an inverting input. In this configuration, each set of drivers 209, 208 sequentially activates the respective switches 103, 104, but simultaneously deactivates them. More particularly, the linked drivers 209, 208 cannot activate the relevant switches 103, 104 until the control signal has been transmitted from the lead drivers 110, 111 through the preceding linked driver 209, 208, as each linked driver 209, 208 has a programmed delay. Each linked driver 209, 208 receives the control signal from the controller 101 at the same time, allowing for the linked drivers 209, 208 to simultaneously deactivate the switches 103, 104. Sequenced activation and collective deactivation of the switches 103, 104, or deactivating the synchronous switches 104 simultaneously with or immediately before activating the corresponding control switches 103 in the various segments, tends to inhibit shoot-through current associated with having both the control switch 103 and the synchronous switch 104 in a segment activated at the same time, thus improving efficiency and reliability.

The switch circuit 116 performs the step-down function for the power supply by alternately connecting two voltages, for example the main supply voltage 99 and ground, to the output of the power stage 160. The switch circuit 116 is connected to the main supply 99 and ground, and periodically alternately connects the output of the switch circuit 116 to the main supply 99 and to ground according to the signals from the driver circuit 115. The switch circuit 116 may comprise any suitable system for controlling the voltage and/or current supplied to the output, such as a physical switch, latch, relay, transistor, diode, amplifier, or the like. In the present embodiment, the switch system 116 is fully switched so that the switch system 116 is substantially either fully on or fully off.

In the present embodiment, the switch circuit 116 comprises the control switches 103 and the synchronous switches 104. The control switches 103 are activated to selectively connect the output to the main supply 99 according to signals from the control driver circuit 115, and the synchronous switches 104 are activated to selectively connect the output to ground according to signals from the synchronous driver circuit 208. If the control switches 103 are turned on and the synchronous switches 104 are turned off, the output voltage of the power stage 160 charges the filter 105. If the synchronous switches 104 are turned on and the control switches 103 are turned off, then the power stage 160 output is connected to ground and the filter 105 discharges to the load.

In the present exemplary embodiment, the switches 103, 104 comprise field effect transistors, such as high-current MOSFETs, for example rated for currents in a range of about 10 A to 50 A. The MOSFETs may be selected according to any appropriate criteria, such as power delivery efficiency performance and desired load current delivery requirements. The switches 103, 104 activate or turn on, closing an open connection, when sufficient voltage and/or current is applied to the gate, and deactivate or turn off when the voltage and/or current is removed, opening the connection. In some applications, the control and synchronous MOSFETs may need to handle high currents, such as about 10 A to about 50 A, and are significantly larger than typical MOSFETs. The parasitic capacitance of such devices may be relatively high (typically around 10 nF), and the gate to source capacitance (Cgs), gate to drain capacitance (Cgd), and drain to source capacitance (Cds) may be significant contributors to the overall performance of the switching power supply 100.

The control switches 103 selectively connect the main supply voltage 99 to the filter 105 and load 98 according to signals from the leading drivers 102 and control drivers 109. The control switches 103 may comprise any suitable number of switches, shown in FIGS. 2 and 3 as four MOSFETs 124, 125, 126, 127. Each control MOSFET 124, 125, 126, 127 has a terminal connected to the main supply 99 and a terminal connected to the load 98 via the filter 105. Thus, when each control MOSFET 124, 125, 126, 127 is activated, it connects the main supply 99 to the filter 105 and load 98. The gate of the first control MOSFET 124 is connected to the output of the non-inverting driver 110, and the gates of the remaining control MOSFETs 125, 126, 127 are connected to the outputs of the control drivers 121, 122, 123, respectively.

In the present embodiment, the control MOSFETs' 124, 125, 126, 127 gate voltage levels may be set relative to their sources. The node is referred to as the swing node, as the node swings from ground to the input voltage, and the gate voltage tracks these transitions. The control drivers are boot-strapped drivers having their negative terminals tied to the swing node and positive terminals is fixed relative to the swing node.

The synchronous switches 104 selectively connect the input of the filter 105 to ground according to signals from the leading drivers 102 and synchronous drivers 108. The synchronous switches 104 may comprise any suitable number of switches, shown in FIGS. 2 and 3 as four MOSFETs 128, 129; 130, 131. Each synchronous MOSFET 128, 129, 130, 131 has a terminal connected to ground and a terminal connected to the load via the filter 105. Thus, when each synchronous MOSFET 128, 129, 130, 131 is activated, it connects the input of the filter 105 to ground. The gate of the first synchronous MOSFET 128 is connected to the output of the inverting driver 111, and the gates of the remaining synchronous MOSFETs 129, 130, 131 are connected to the outputs of the synchronous drivers 118, 119, 120, respectively.

Figure 4:
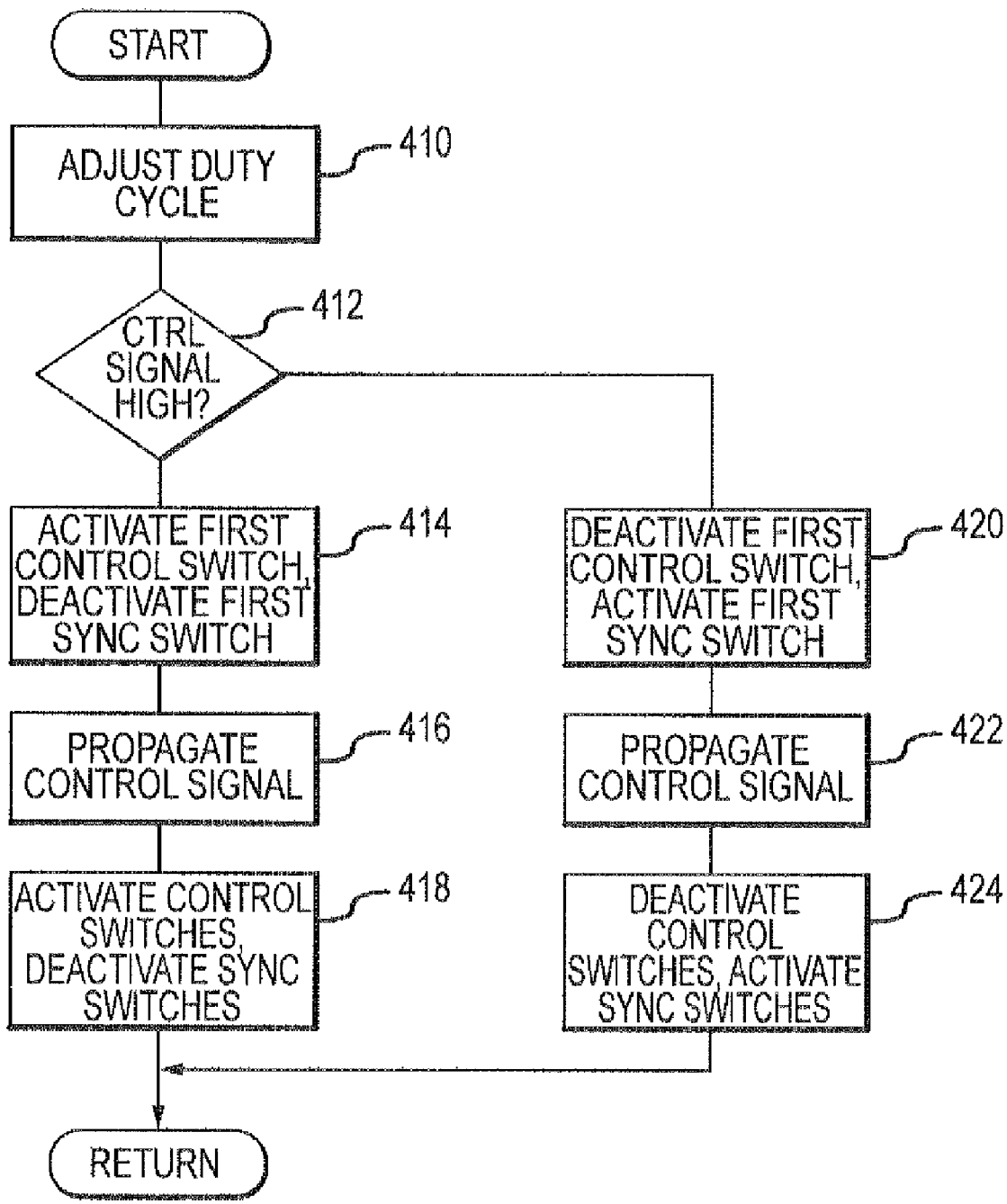
FIG. 4 is a flow chart illustrating operation of a switching power supply.

In operation, referring to FIG. 4, the controller 101 receives a reference voltage signal and a feedback signal via the feedback loop 106, and varies the duty cycle of the control signal according to the difference (410). When the controller 101 outputs a high control signal (412), the non-inverting driver 110 receives the signal and activates the first control switch 124 and the inverting driver 111 deactivates the first synchronous switch 128 (414). The response of the non-inverting driver 110 is propagated to the control drivers 109, each of which receives the signal in sequence after the programmed delay in each preceding control driver 109 (416). The control drivers 109 sequentially activate the control switches 125, 126, 127. Likewise, the synchronous drivers 108 receive the inverse control signal via the inverting driver 111 after the programmed delay in each synchronous driver 108, and sequentially deactivate the respective synchronous switches 129, 130, 131 (418). The control switches 103 supply power to the filter 105 and load 98 by transmitting the main supply 99 voltage during the remaining high portion of the control signal cycle.

When the controller 101 changes the control signal to low, the non-inverting driver 110 receives the signal and deactivates the first control switch 124 (420). The control drivers 109 sequentially receive the propagating low signal (422) and deactivate the remaining control switches 125, 126, 127 (424). Likewise, the inverting driver 111 receives the low control signal, activates the first synchronous switch 128, and sequentially propagates the inverse control signal to the synchronous drivers 108, which sequentially activate the remaining synchronous switches 129, 130, 131. The filter 105 discharges during the remaining low signal portion of the control signal cycle.

In another exemplary embodiment, the linked switching power supply 200 operates in the same manner as the switching power supply 100, except that the control switches 103 may be activated sequentially and deactivated simultaneously, and/or the synchronous switches 104 may be activated sequentially and deactivated simultaneously. For example, when the controller 101 asserts a high control signal, the non-inverting driver 110 receives the signal, activates the first control switch 124, and the linked control drivers 209 receive the signal sequentially and sequentially activate the remaining control switches 125, 126, 127. The inverting driver 111 and the linked synchronous drivers 208 receive the signal simultaneously, deactivating the synchronous switches 104 at the same time. Conversely, when the controller 101 asserts a low control signal, the non-inverting driver 110 and the linked control drivers 209 receive the signal simultaneously, deactivating the control switches 103 at the same time. The inverting driver 111 receives the signal, activates the first synchronous switch 128. The linked synchronous drivers 208 receive the signal sequentially and sequentially activate the remaining synchronous switches 129, 130, 131.

The segmented circuit 116 facilitates noise reduction by reducing the amplitude of the current being switched. Lower currents are required to activate the several integrated MOSFETs than are required for conventional, discrete MOSFETs. The system noise associated with switching large currents through coupling and ground return path parasitics may be significantly reduced by staggering the activation and deactivation of each segment. Thus, switching noise may be reduced by staggering the activation and deactivation of each segment of the power stage 160.

In addition, the present integrated segmented power stage and the staggered timing allow the non-overlap time to be minimized. For example, the integrated nature of the power stage 160 permits the tighter control of the timing because all signals are internal to the chip. In addition, slight overlap is not as critical because not all segments are on, and any shoot-thru current that might occur is significantly lower.

Further, the segmented power stage 160 facilitates optimizing the reliability of the power stage 160. For example, the layout of the components may affect the performance of the chip. Components positioned closer to the edge of the chip or closer to the output pads may operate at different temperatures. Controlling which power segments are activated and deactivated according to placement on the chip may facilitate better power dissipation in "hot" spots.

In the foregoing specification, the invention has been described with reference to specific exemplary embodiments. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

The invention claimed is:

1. A voltage converter for converting an input voltage to an output voltage at an output, comprising a switching regulator including:
a controller configured to generate a control signal;
a plurality of power switches coupled in parallel between the input voltage and the output,
wherein at least one of the plurality of power switches is an n-type control switch; and
a driver circuit responsive to the controller and connected to the plurality of power switches,
wherein:
the driver circuit is configured to control the plurality or power switches according to the control signal; and
the driver circuit is configured to sequentially activate the plurality of power switches in a predetermined sequence and subsequently deactivate the plurality of power switches simultaneously.

2. The voltage converter of claim 1, wherein the plurality of power switches and the driver circuit are integrated on an integrated circuit chip.

3. The voltage converter of claim 2, wherein at least one of the plurality of power switches and the driver circuit comprises a hot-running element that operates at a greater temperature than another element, and wherein the hot-running element is positioned near an edge of the integrated circuit chip.

4. The voltage converter of claim 1, wherein the driver circuit comprises a series of delay elements, and wherein a first delay element is configured to provide a first signal to a first one of the plurality of power switches in response to the control signal to activate the first power switch and a second delay element is configured to provide a second signal to a second one of the plurality of power switches following a delay after provision of the first signal to activate the second power switch.

5. The voltage converter of claim 4, further comprising a capacitor connected to the drive circuit and to a drive voltage, wherein the capacitor has a capacitance sufficient to support the provision of the first signal and the second signal sequentially, but not sufficient to support the provision of the first signal and the second signal simultaneously.

6. The voltage converter of claim 1, further comprising a second plurality of power switches coupled in parallel between the output and ground, wherein each of the second plurality of power switches has a terminal coupled to a terminal of a corresponding switch in the first plurality of power switches.

7. The voltage converter of claim 6, wherein the driver circuit is connected to the second plurality of power switches, wherein:
the driver circuit is configured to control the second plurality of power switches according to the control signal; and
the driver circuit is configured to deactivate a switch in the second plurality of power switches at least one of substantially immediately before and simultaneously with activating the corresponding switch in the first plurality of power switches.

8. The voltage converter of claim 1, wherein the plurality of power switches comprises high-power MOSFETs.

9. The voltage converter of claim 1, wherein the plurality of power switches comprises substantially identically sized switches.

10. A voltage converter for converting an input voltage from an input voltage source to an output voltage at an output, comprising a switching regulator including:
a pulse width modulation controller responsive to a reference voltage and the output voltage, wherein the controller is configured to generate a control signal according to a difference between the reference voltage and the output voltage;
a filter connected to the output; and
an integrated power stage, comprising:
a plurality of control MOSFETs coupled in parallel between the input voltage source and the filter, wherein the control MOSFETs are configured to connect the input voltage source to the filter when the MOSFETs are activated, wherein at least one of the plurality of control MOSFETs is an n-type MOSFET;
a plurality of synchronous MOSFETs coupled in parallel between the filter and ground, wherein the synchronous MOSFETs are configured to control connect the filter to ground when the MOSFETs are activated, wherein at least one of the plurality of synchronous MOSFETs is an n-type MOSFET; and
a driver circuit, comprising:
a plurality of driver outputs, wherein a gate of each of the control MOSFETs and synchronous MOSFETs is coupled to at least one of the driver outputs; and
a delay circuit responsive to the control signal and coupled to the driver outputs, wherein the delay circuit is configured to generate a first signal at a first driver output in response to the control signal and a second signal following a delay after generation of the first signal at a second driver output, wherein the first and second signals at least one of:
sequentially activate a first and second control MOSFETs from the plurality of control MOSFETs before the first control MOSFET is deactivated; and
sequentially activate a first and second synchronous MOSFETs from the plurality of synchronous MOSFETs before the first synchronous MOSFET is deactivated; and
wherein the driver circuit is configured to at least one of simultaneously deactivate all of the control MOSFETs and simultaneously deactivate all of the synchronous MOSFETs.

11. The voltage converter of claim 10, wherein at least one of the MOSFETs, driver outputs, and delay circuit comprises a hot-running element that operates at a greater temperature than another element, and wherein the hot-running element is positioned near an edge of an integrated circuit chip.

12. The voltage converter of claim 10, further comprising a capacitor connected to the driver circuit and to a drive voltage, wherein the capacitor has a capacitance sufficient to support the generation of the first signal and the second signal sequentially, but not sufficient to support the generation of the first signal and the second signal simultaneously.

13. The voltage converter of claim 10, wherein the plurality of synchronous MOSFETs comprises substantially identically sized switches.

14. A method for converting an input voltage to an output voltage, comprising:
generating a control signal corresponding to a difference between a reference voltage and the output voltage;
connecting the input voltage to an output via a first power switch of a switching regulator at a first time in response to the control signal;
connecting the input voltage to the output via a second power switch of the switching regulator at a second time following a predetermined delay after the first time, wherein at least one of the first power switch and the second power switch is an n-type control switch, wherein the first and second power switches sequentially connect the input voltage to the output in response to a single active portion of the control signal; and
subsequently deactivating the first and second power switches simultaneously.

15. A method for converting an input voltage according to claim 14, further comprising connecting the output to ground via a third power switch of the switching regulator at or immediately after the first time.

16. A method for converting an input voltage according to claim 14, further comprising disconnecting the input voltage from the output via the first power switch and the second power switch at a third time in response to the control signal.

17. A method for converting an input voltage according to claim 14, further comprising filtering the output voltage.

18. A method for converting an input voltage according to claim 14, wherein the first and second power switches are substantially identically sized.

* * * * *